US011664478B2

(12) United States Patent
Rosenbauer

(10) Patent No.: US 11,664,478 B2
(45) Date of Patent: May 30, 2023

(54) LED LIGHT WITH REDUCED STROBOSCOPIC FLICKERING

(71) Applicant: LEDVANCE GMBH, Garching bei Munich (DE)

(72) Inventor: Georg Rosenbauer, Wassertrudingen (DE)

(73) Assignee: LEDVANCE GMBH, Garching bei Munich (DE)

( * ) Notice: Subject to any disclaimer, the term of this patent is extended or adjusted under 35 U.S.C. 154(b) by 290 days.

(21) Appl. No.: 16/794,869

(22) Filed: Feb. 19, 2020

(65) Prior Publication Data
US 2020/0274032 A1    Aug. 27, 2020

(30) Foreign Application Priority Data

Feb. 22, 2019 (DE) .......................... 102019104552.5
Apr. 17, 2019 (DE) .......................... 102019110222.7

(51) Int. Cl.
*H01L 33/44* (2010.01)
*H01L 33/50* (2010.01)
*H01L 33/62* (2010.01)

(52) U.S. Cl.
CPC ............ *H01L 33/44* (2013.01); *H01L 33/502* (2013.01); *H01L 33/62* (2013.01)

(58) Field of Classification Search
CPC ....... H01L 33/44; H01L 33/502; H01L 33/62; H01L 25/0753; H01L 33/504; H01L 33/50; H01L 25/167
See application file for complete search history.

(56) References Cited

U.S. PATENT DOCUMENTS

| 2007/0273299 | A1* | 11/2007 | Miskin | H05B 45/39 |
| | | | | 315/250 |
| 2010/0025700 | A1* | 2/2010 | Jung | H01L 25/0753 |
| | | | | 257/89 |
| 2013/0126918 | A1* | 5/2013 | Hsieh | H05B 33/10 |
| | | | | 257/89 |
| 2016/0190397 | A1* | 6/2016 | Lin | H01L 33/56 |
| | | | | 257/98 |

* cited by examiner

*Primary Examiner* — Su C Kim
(74) *Attorney, Agent, or Firm* — Hayes Soloway PC

(57) ABSTRACT

An LED light with an LED module which has one or more LEDs and an LED driver for power supply to the LEDs. The LED module is at least partially coated with a photoluminescent phosphor, which is configured for absorption of light energy from the LEDs and time-delayed emission of the stored light energy, and the LED driver has at least one electronic component for smoothing the current to be output to the LEDs.

19 Claims, 4 Drawing Sheets ered by the light buffers. The implementation of a plurality of light buffers according to WO 2009/040111 A1 is, therefore, unsuitable or only has a limited suitability for the above-mentioned small LED lights.

LED LIGHT WITH REDUCED STROBOSCOPIC FLICKERING

CROSS-REFERENCE

The present application claims priority from German Patent Application no. 102019104552.5 filed on Feb. 22, 2019. The present application claims priority from German Patent Application no. 102019110222.7 filed on Apr. 17, 2019. Each of these patent applications is incorporated by reference herein in its entirety.

TECHNICAL FIELD

The present invention relates to an LED light with an LED module which has one or more LEDs, and an LED driver for power supply to the LEDs.

BACKGROUND

In lighting elements flickering often occurs, the cause of which lies in the AC component of the electric current which flows through the lighting element. The problem is particularly pronounced for LED lights, since they immediately cease to illuminate when the current falls below a specific threshold value.

In the case of LED lights which are operated on alternating current sources, rectifiers with smoothing capacitors are usually required for suppression or reduction of the flickering. This electronic unit is designated as a "driver" or also an "electronic ballast" and converts the AC output voltage into a direct current which is suitable for operating the LED light. The quality of the driver determines how low the degree of flickering of the LEDs is.

In order to effectively avoid current/voltage fluctuations at the output of the driver, comparatively large capacitors must usually be used, but these require considerable space. An added complication is that SMD smoothing capacitors are expensive and can exhibit a so-called "derating". Specifically, their capacitance decreases in the event of voltage increases, for example, a decrease by 70% with an increase of about 300 V. However, less expensive electrolytic capacitors are almost exclusively wired, are prone to gaseous emission and have a comparatively short service life and a large installation space. Therefore, a smoothing based exclusively on capacitors is rather unsuitable for small LED lights, in particular for LEDs directly mounted on printed circuit boards (chip-on-board technology) such as, for instance, LED downlight lamps, LED floodlight lamps, LED retrofit lamps with G9 or GU10 bases or LED filament lamps with an electronic driver on the LED-COB filament. Moreover, the electronic driver necessitates an additional manufacturing effort and increases the probability of failure of the LED light. In addition to the chip-on-board assembly by means of die and wire bonding, an SMD soldering process or PTH mounting process (clamping or soldering) must also follow in order to integrate the smoothing capacitors into the chip-on-board circuit.

In the past there have been no sufficiently large smoothing capacitors available on the market which can be placed on the support PCB solely by means of chip-on-board assembly.

It is known that one can reduce the flickering of an LED light by phosphorescent or luminescent materials. Thus, WO 2009/040111 A1 describes an LED light with light buffers for absorption of light energy of the LEDs and time-delayed emission of the stored light energy. The light buffers serve to absorb the light energy of the LEDs during the illumination (pumping) in order to emit the stored energy in the off-phase of the LEDs and to illuminate further (relaxation), so that the flickering of the LED lights is reduced.

The flicker reduction can be optimized by the use of a plurality of light buffers with different relaxation times, for instance dependent on wavelength. Thus, WO 2009/040111 A1 discloses for example a layered application of white, yellow and red phosphor. However, the layered application of a plurality of light buffers is associated with a high complexity and high material costs, since the phosphor layers are produced from rare materials. Furthermore, the use of a plurality of light buffers at different distances necessitates a considerable installation space. The implementation of a plurality of light buffers according to WO 2009/040111 A1 is, therefore, unsuitable or only has a limited suitability for the above-mentioned small LED lights.

The problem of flicker reduction is exacerbated by the ever increasing demands of the user and official requirements. Under the customary flicker metrics, which utilize various methods in order to measure and to quantify the flickering, the stroboscopic effect visibility measure (SVM) is important. This measure is based on the sum of weighted Fourier components.

Details for determination of the SVMs and the SVM sensitivity curve are contained in the documentation CIE TN 006:2016 of the International Commission on Illumination.

A reduction of the stroboscopic flickering below an SVM value of approximately 1.6, 1.0 or even 0.4 cannot be readily implemented in particular for small LED lights, since an electronic smoothing of the current to be fed to the LEDs and an optical smoothing by time-delayed emission by means of phosphorescent materials preclude a miniaturisation of the LED modules and LED lights.

SUMMARY

An object of the present invention is to provide an improved LED light, in particular to reduce the stroboscopic flickering in a compact and cost-effective design of the LED light.

The LED light according to the invention has an LED module with one or more LEDs. In the case of a plurality of LEDs, these can be series-connected. However, parallel connections and mixtures of parallel and series connection are also possible. The LEDs are preferably SMD-LEDs and/or COB-LEDs.

The designation "LED light" here considers in particular LED lamps, of which the driver is at least partially integrated and which are provided for direct assembly on printed circuit boards or for insertion in sockets. In particular, LED retrofit lamps are considered. Further examples are: LED downlight lamps; LED floodlight lamps, LED lamps with G9, R7s, GU10, GX53, G4, G5, G13, E14, E27 base and LED filament lamps with electronic driver on the LED-COB filament.

The LED light also has an LED driver which is configured for power supply to the LEDs. The LED driver includes electric and/or electronic components, in order to provide a power supply appropriate for the LEDs from an output voltage. The output voltage can be a conventional mains AC voltage, for example clocked with a frequency of 60 Hz. However, the LED driver can also be configured for a different output voltage, for example for conversion of a power supply which was originally conceived for a different device, so that the LED light can be used, for instance, as a retrofit lamp in existing sockets and is compatible with existing power supplies.

According to the invention the LED module is at least partially coated with a photoluminescent phosphor, which is configured for absorption of light energy from the LEDs and time-delayed emission of the stored light energy. The photoluminescent phosphor is positioned preferably directly in contact with the LEDs. Furthermore, the LED driver has at least one electronic component (in addition to any rectifier) for smoothing of the current to be output to the LEDs. The LED driver preferably has a rectifier, for instance a bridge rectifier. The starting point for the smoothing in this case is the voltage output by the rectifier. Specifically, if the LED driver already receives a DC voltage as output voltage, this serves as a starting point for the smoothing. In both cases, in spite of rectification, the voltage usually has a periodic AC component, usually with double the frequency of the mains voltage. The designations "photoluminescent phosphor" and "light buffer" are used synonymously here.

In order to effectively reduce the flickering of the LED light, in particular the stroboscopic flickering, the cause of which lies in the AC component of the electric current, an optical smoothing and an electronic smoothing are combined.

The optical smoothing takes place by means of the photoluminescent phosphor. The photoluminescent phosphor coats the LED module at least partially. In this sense the photoluminescent phosphor functions as a "near-zone light buffer", since it is located on the LEDs or at least in the immediate vicinity of the LEDs. The photoluminescent phosphor coating has a specific relaxation time, so that the light energy emitted by the LEDs is initially absorbed to a significant extent by the photoluminescent phosphor and is emitted again with a time delay, with the relaxation time at the same or a changed wavelength. Thus, due to the photoluminescent phosphor, the light flux peaks of the LEDs "blur" so that the flickering of the LED light is reduced. As the LED light preferably only uses one single photoluminescent phosphor, the near-zone light buffer, the dimension thereof does increases insignificantly, if at all. Furthermore, the electronic smoothing by application of the near-zone light buffer may turn out to be less substantial and more cost-effective, so that the optical and electronic smoothing interact synergistically in order to achieve a low SVM value for LED lights of compact construction.

The LED driver and/or the connection of the LEDs are preferably configured in order to reduce the off-time of the LEDs triggered by the rectifier. The time per period in which the LEDs are not sufficiently supplied with current by the AC component is designated here as off-time. In particular the off-time is determined by the rectifier or substantially by the rectifier.

Correspondingly, the time per period in which the LEDs are supplied with sufficient current for lighting is designated as on-time. A reduction of the off-time can be achieved by the arrangement or connection of the LEDs, so for instance the number of series-connected LEDs per strand has an influence on the off-time. For example, various LED strands can be connected by one or more driver ICs, in order to reduce the off-time of the LED module to a minimum. Furthermore, the driver topology has an influence on the off-time. Thus, in the simplest situation, a current limiter and/or resistors can be connected in order to reduce the off-time. In this way the stroboscopic flickering in the context of the electronic smoothing can be reduced.

The ratio of the off-time to the on-time, also designated herein as "$T_{off/on}$", is preferably 0.8 or less, more preferably 0.1 or less. Such a reduction can be achieved without considerably increasing the dimensions and costs of construction of the LED driver. A combination with the optical smoothing described above allows a reduction of the SVM value to up to 1.6.

The LED driver preferably has at least one smoothing capacitor parallel-connected to the LEDs. In this case the smoothing capacitor is preferably a small capacitor of for example 1 to 5 µF. The required capacitance may also be implemented by a plurality of even smaller parallel-connected capacitors. Thus, the dimensions of the LED light are increased insignificantly, if at all. The smoothing capacitor may be designed, for example, as a PTH electrolyte capacitor or PTH film capacitor or as a SMD ceramic capacitor with low derating. The time ratio, $T_{off/on}$, can be reduced to nearly 0 by application of a smoothing capacitor. A combination with the optical smoothing described above allows a reduction of the SVM value to below 0.4.

The LED driver is preferably configured in order to increase the frequency of the current to be output to the LEDs and/or to modulate it. This constitutes a third optional or additional electronic measure for reduction of the stroboscopic flickering. The basis for this is the fact that the SVM value can be reduced by frequency-increasing measures with a constant ratio $T_{off/on}$.

The LED driver preferably has at least one IC (integrated circuit) and/or at least one current limiter diode and/or at least one internal semiconductor-based transistor switch for increasing the frequency and/or modulating the current.

Alternatively, or in addition, the LED driver can preferably have at least one IC (integrated circuit) and/or at least one current limiter diode and/or at least one internal semiconductor-based transistor switch for connection of LED strands.

In order to improve reduction of the stroboscopic flickering without considerable additional structural costs and without significant enlargement of the LED light, a plurality of the measures described above are preferably combined. Particularly preferably, all three electronic measures are combined with the optical smoothing, so that a reduction of the SVM value to an SVM value of almost 0 can also be achieved with an LED light with chip-on-board technology (COB) and an integrated driver.

One or more suitable luminescent materials, in particular based on phosphor, can be used as material for the photoluminescent phosphor. Alternatively, light-emitting quantum dots can also be used. The photoluminescent phosphor preferably has a relaxation time of 5 ms or more, in order to optimize the SVM reduction.

The LED module preferably comprises a circuit board which is equipped with the LEDs and the electronic and/or electric driver components. The driver components include for example IC(s), MOSFET(s), diode(s), capacitor(s), coil(s), switch(es) etc. Preferably the LED driver and the LED module are spatially and structurally integrated, for example on one single LED filament strip or in a compact COB light with driver board and LED circuit board combined in one component. In this way a particularly compact, cost-effective and low-flicker LED light can be provided. Furthermore, the LED light preferably has a base, for instance a retrofit base, such as for example G9, R7s, GU10, GX53, G4, G5, G13, E14 or E27.

The LED light is preferably configured in order to be operated by means of the Zhaga standards. Due to the extremely compact design, the LED lights described here, for instance 120V AC lights, can also be operated in the Zhaga standards which are provided merely for light modules without electronic drivers.

The LED light preferably has a glass shell, closed so as to be gas-tight, which is preferably filled with a helium-containing gas, wherein the LED module and the LED driver are arranged in the glass shell, so that the LED light can be particularly compact and can have a long service life. The long service life can be increased particularly by the use of one or more small smoothing capacitors without or with only low gaseous emission.

The LED module preferably has an $Al_2O_3$ ceramic circuit board with high thermal conductivity or a metal core circuit board as carrier material.

Preferably, the LED driver is a two-channel driver and the LED module has two LED strands with different photoluminescent phosphor which are controllable by the LED driver. The two different light buffers or photoluminescent phosphor portions have preferably light colors of approximately 2700 K and 6500 K. Preferably the two light buffers are arranged adjacent to one another and are illuminated by various portions of the LEDs.

Further advantages and features of the present invention are disclosed by the following description of preferred exemplary embodiments. The features described there can be implemented singly or in combination with one or more of the features described above, in so far as the features do not conflict. The following description of the preferred exemplary embodiments is given with reference to the accompanying drawings.

DETAILED DESCRIPTION OF PREFERRED EXEMPLARY EMBODIMENTS

Preferred exemplary embodiments are described below with reference to the drawings. In this case elements which are the same, similar or act in the same way are provided with identical references in the different drawings. Repeated description of some of these elements is omitted in order to avoid redundancies.

Figure 1A:
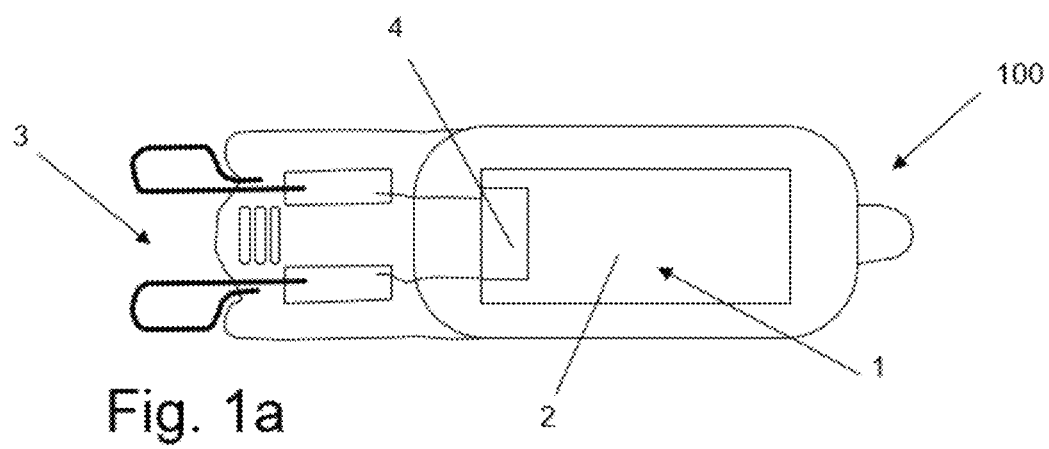
FIGS. 1a and 1b show an LED light with an LED module which is coated with a photoluminescent phosphor, an LED driver and a G9 base.
Figure 1B:
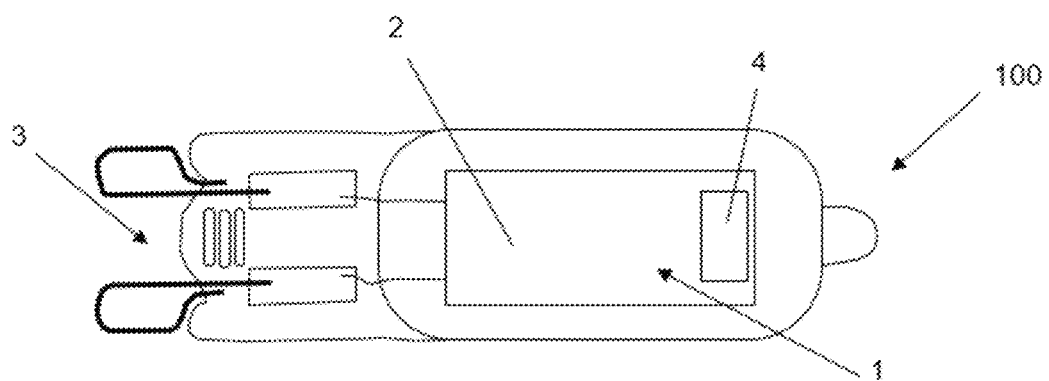

FIGS. 1a and 1b show an LED light 100 with an LED module 1 which is coated with a photoluminescent phosphor 2, a base 3 which is designed here as a G9 base, and an LED driver 4. In the example of FIG. 1a the LED driver 4 is arranged on the base-side end of the LED module 1, whilst the LED driver 4 in the example of FIG. 1b is arranged at the opposite end of the LED module 1.

FIG. 1c shows schematically how the contact pads lie in the case of an opposing arrangement.

The LED module 1 is preferably constructed as a compact COB unit, with a circuit board which is equipped with one or a plurality of LEDs. The driver components of the LED driver 4 are preferably likewise located on the circuit board of the LED module 1.

Figure 2:
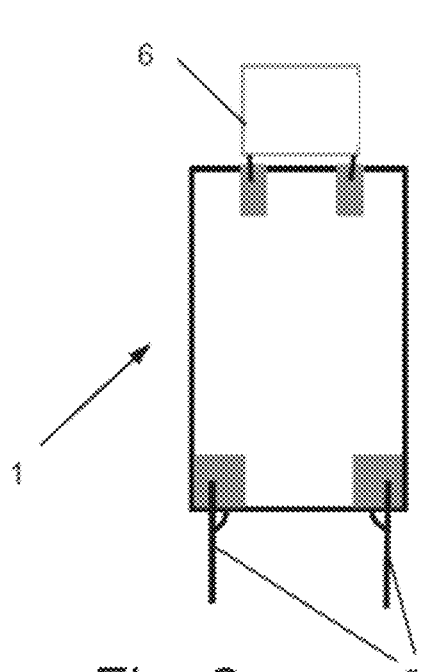
FIG. 2 shows an LED module with connections for the attachment of a smoothing capacitor.

An example of an LED module 1 is shown in FIG. 2. The LED module 1 is designed as a compact COB unit and has four contact pads. Two contact pads are provided for connectors 5, for instance to a 120V AC mains voltage, wherein the connectors 5 are for example soldered on, inserted or are an integral component of the LED module 1. Furthermore, the LED module 1 according to the embodiment of FIG. 2 has two further contact pads which are configured for the attachment of a smoothing capacitor 6. Moreover, the LED module 1 has one or more LEDs (not illustrated).

Figure 3:
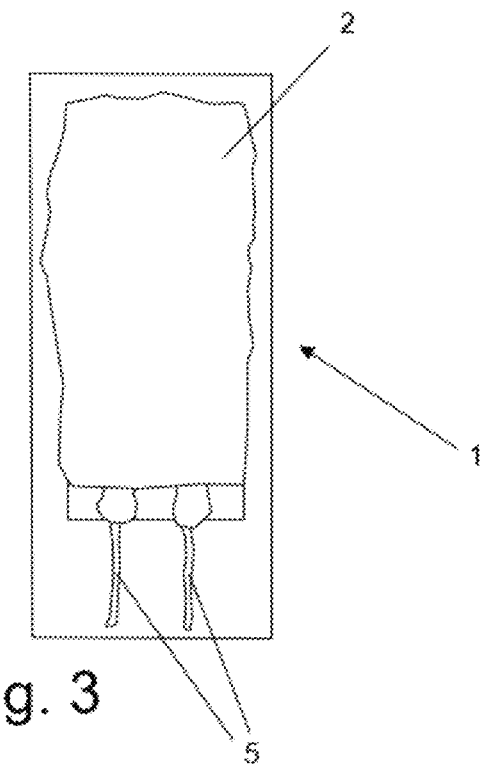
FIG. 3 shows the LED module coated with a photoluminescent phosphor.

The LED module 1 is substantially, completely or at least mainly coated with the photoluminescent phosphor 2, as shown in FIG. 3. The photoluminescent phosphor 2 is made of a transparent material provided with phosphorescent additions and is preferably applied directly to the LED module 1, so that it covers the LEDs. Since the photoluminescent phosphor 2 is located in close proximity to the LEDs, and is preferably directly in contact with them, it can also be designated as a "near-zone light buffer".

The photoluminescent phosphor 2 has a specific relaxation time t_relax_n, so that the light energy emitted by the LEDs is initially absorbed to a significant extent by the photoluminescent phosphor 2 and is emitted again with a time delay with the relaxation time t_relax_n at the same or a changed wavelength. Thus, due to the photoluminescent phosphor 2 the light flux peaks of the LEDs "blur", so that flickering of the LED light 100 is reduced. The optical flicker reduction can be optimised by a suitable choice of the thickness and of the material of the photoluminescent phosphor 2.

Thus, for example a white, yellow or red phosphorus-containing material can be used as photoluminescent phosphor 2. The photoluminescent phosphor 2 preferably has a high relaxation time, for example 5 ms or more. An SVM value of approximately 1.6 could be demonstrated experimentally by application of a red phosphor.

In order to further reduce the SVM value for small LED lights 100, the photoluminescent phosphor 2 is combined with an electronic smoothing. This can turn out to be more compact and more cost-effective due to the use of the photoluminescent phosphor 2, so that the optical and electronic smoothing interact synergistically in order to achieve a lower SVM value for such an LED light 100. For this purpose, the LED light 100 has the LED driver 4, the electronic components of which are preferably arranged and connected on a circuit board in the LED light 100.

According to a preferred embodiment, the electronic smoothing takes place by reduction of the off-time, i.e. the time per period in which the LEDs are not sufficiently supplied with current by the periodic AC component.

Figure 4A:
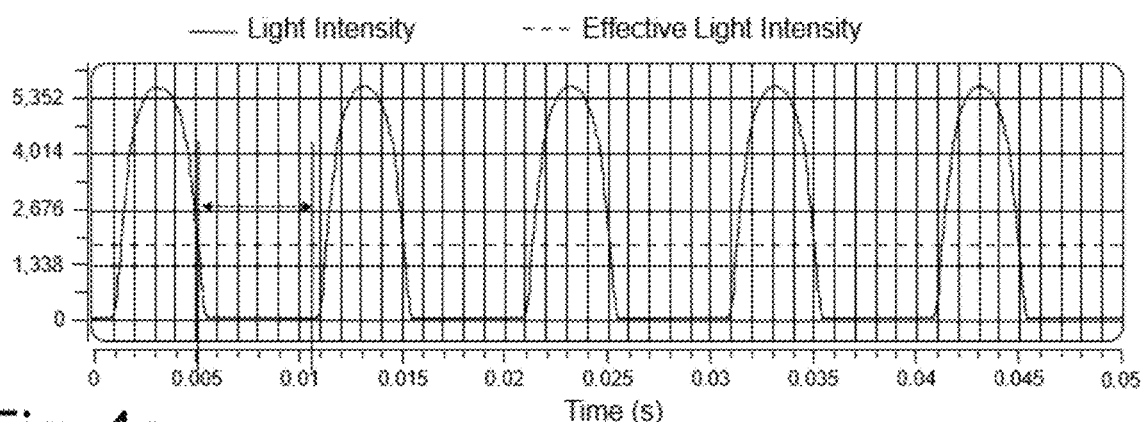
FIG. 4a shows a diagram of an example of periodic light intensity as a function of the time without optical and electronic smoothing.
Figure 4B:
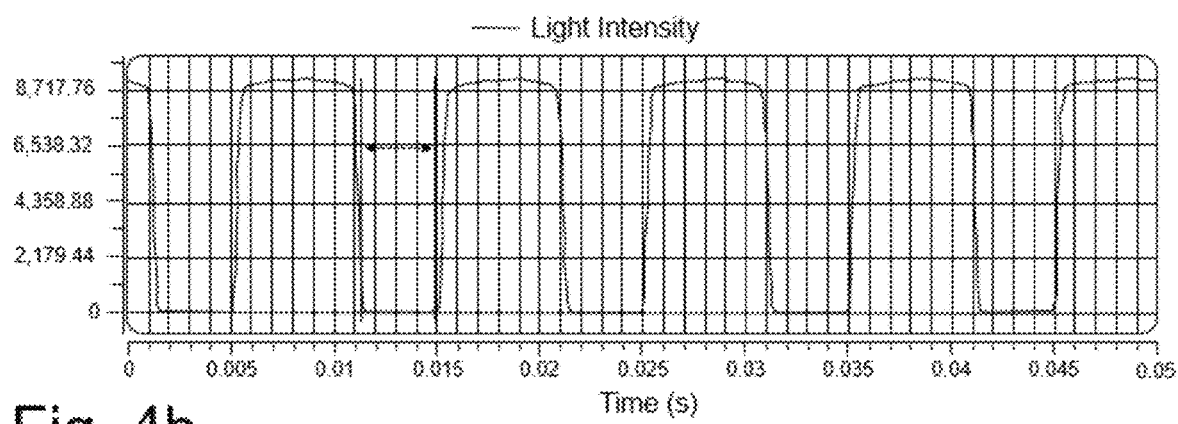
FIGS. 4b and 4c show the progression of exemplary light intensities for the case of a reduced off-time.

FIG. 4a shows a diagram of an example of periodic light intensity (y axis) as a function of the time (x axis) without optical and electronic smoothing. FIG. 4b shows the progression of light intensity for the case of a reduced off-time.

The ratio of the off-time to the on-time, also designated here as "$T_{off/on}$", in the exemplary case of FIG. 4a without electronic smoothing is approximately 1.5, so that the SVM value is approximately 6. In both cases, FIGS. 4a and 4b, the frequency is approximately 120 Hz, or double the mains frequency of 60 Hz. The doubling takes place through the rectification of the mains voltage. For this purpose, the LED driver 4 has a rectifier, for instance a bridge rectifier.

A reduction of the off-time can be achieved by the arrangement or connection of the LEDs. Furthermore, the driver topology has an influence on the off-time. Thus, for this purpose a current limiter and/or resistors can be connected.

After the electronic reduction of the off-time according to FIG. 4b, $T_{off/on}$ is 0.8 or less, particularly preferably 0.1 or less. Such a reduction can be achieved without considerably increasing the dimensions and costs of construction of the LED driver 4. At the same time with such a reduction of the off-time, an SVM value of below 4 can be achieved. Thus, a combination with the optical smoothing described above allows a reduction of the SVM value to up to 0.4.

Figure 4C:
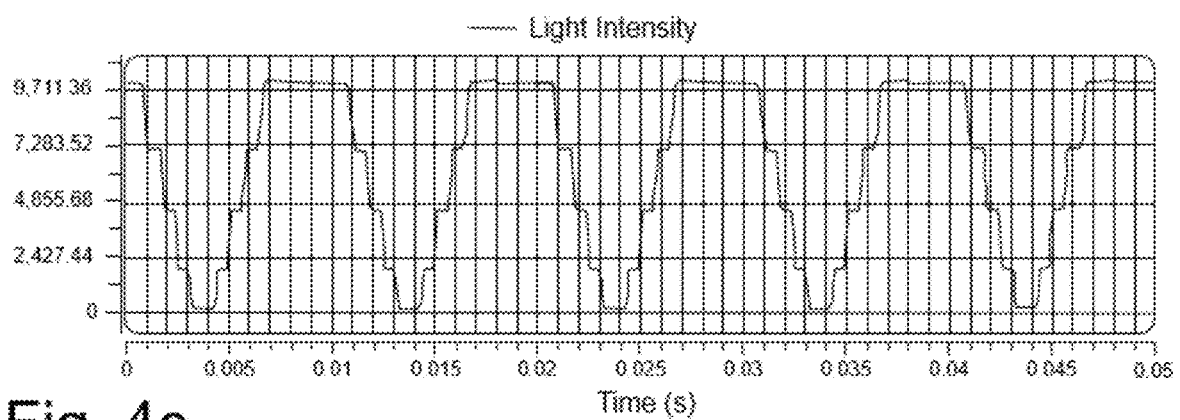

FIG. 4c shows another progression of the light intensity for the case of a reduced off-time. In this case the off-time is achieved by a step-like modulation of the periodic light intensity. Such a modulation can be achieved by an LED driver 4 on the basis of a transistor which selectively switches LEDs or LED strands on and off.

Alternatively, or in addition to the electronic solution described above, an electronic smoothing can be achieved by parallel connection of a smoothing capacitor as part of the LED driver 4 to the LEDs. In this case, the smoothing capacitor is preferably a small capacitor having a capacitance of 1 to 5 µF, more preferably 1 to 3 µF, so that the dimensions of the LED light 100 are only insignificantly increased, if at all. The addition of a large smoothing capacitor, generally the standard solution for reduction of the 100 Hz flickering, requires considerable space and is comparatively expensive. In addition, in the case of electrolytic capacitors, wiring is necessary and the problem exists of possible gaseous emission in closed gas-tight LED lights.

Figure 4D:
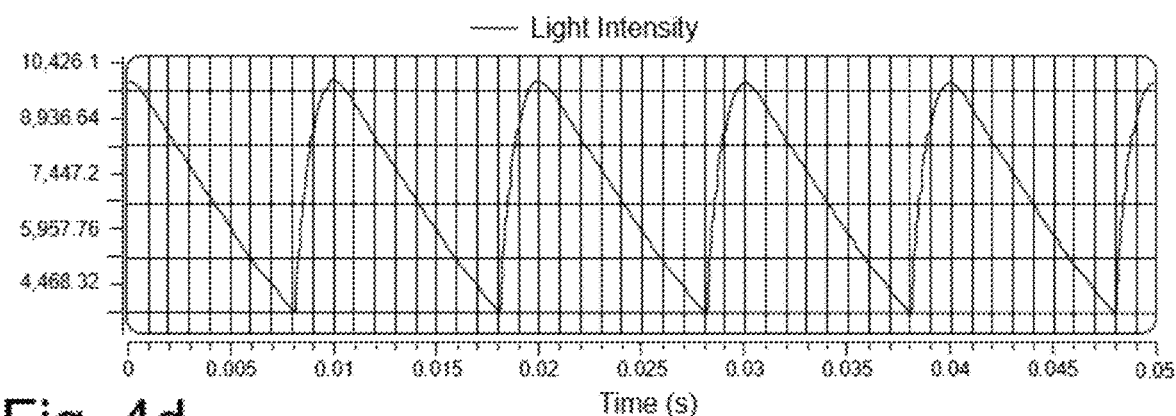
FIG. 4d shows a progression of the light intensity for the case of the parallel connection of a smoothing capacitor.

FIG. 4d shows a progression of the light intensity for the case of connection of a small (2 µF) smoothing capacitor. $T_{off/on}$ can be reduced to up to 0 by this electronic measure. The stroboscopic flickering can be reduced to a SVM value below 3. A combination with the optical smoothing described above allows a reduction of the SVM value to up to 0.4.

A third electronic measure for reduction of the SVM value can be achieved by adding an electronic component, for example an IC (integrated circuit) to the LED driver 4 in order to increase the frequency or modulation of the current to be fed to the LEDs. The basis for this is the fact that the stroboscopic flickering can be reduced by frequency-increasing measures with a constant ratio $T_{off/on}$.

Figure 4E:
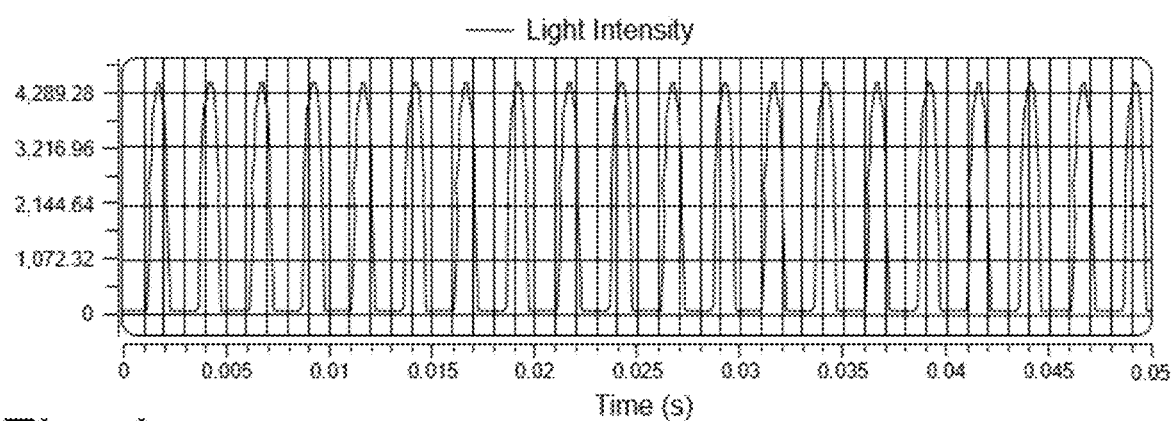
FIG. 4e shows a progression of the light intensity for the case of an increased frequency.

FIG. 4e shows the progression of the light intensity for the case of a frequency increased to 400 Hz. In this way the SVM value is reduced to approximately 2.5. A frequency reduction to 200 Hz results in an SVM value of approximately 4.3, and a frequency increase to 800 Hz results in an SVM value of approximately 1.7. Without a frequency increase the SVM value at a frequency of 60 Hz is approximately 6 to 7.

Figure 4F:
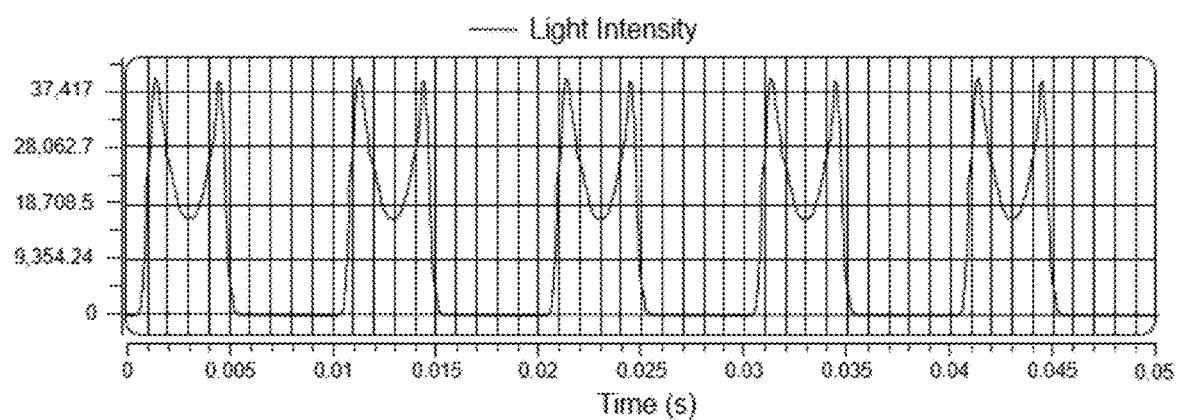
FIG. 4f shows a progression of the light intensity for the case of a modulated frequency.

FIG. 4f shows the light intensity for the case of a modulated current. Furthermore, the basic frequency is 100 Hz, but this has been modulated so that the on-times split into two peaks. As a result, a higher frequency is simulated, which in the present case leads to a reduction of the SVM value from approximately 7 to approximately 5.

Figure 5A:
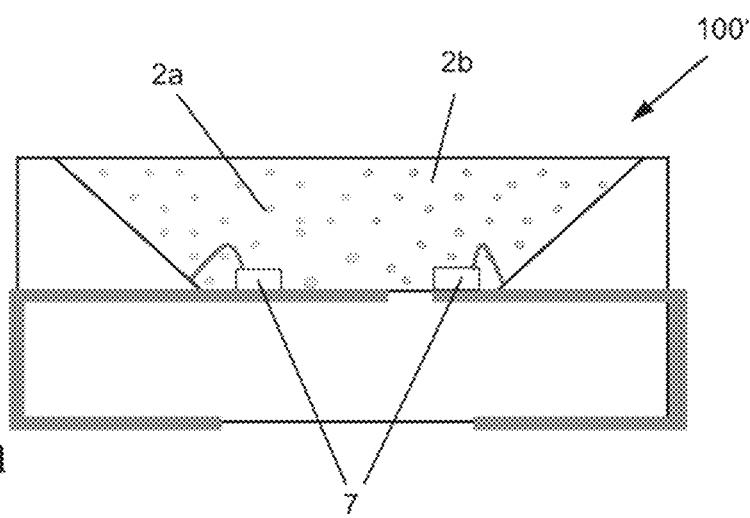
FIGS. 5a and 5b show schematically an LED light in SMD construction from the side and in a view from above.
Figure 5B:
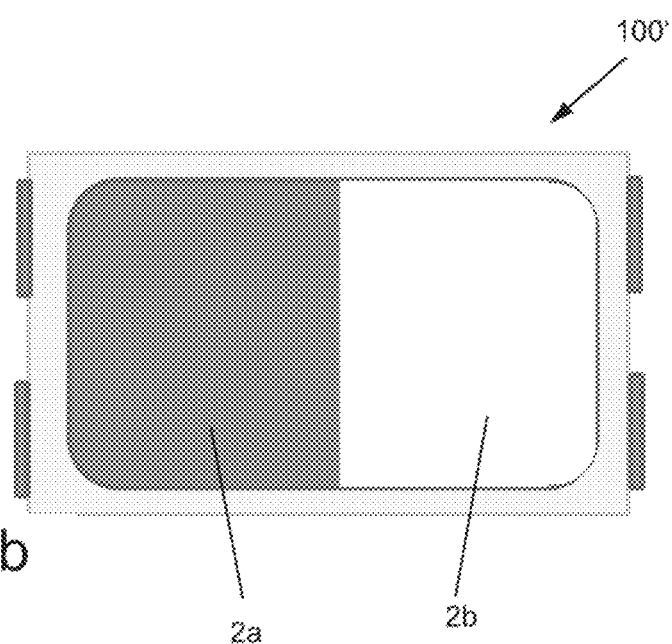

FIGS. 5a and 5b show schematically an LED light 100' in SMD construction from the side (FIG. 5a) and in a view from above (FIG. 5b).

The LED light 100' has two or more LEDs 7, wherein the individual LEDs or LED chips 7 are preferably operated by separate current circuits. According to this exemplary embodiment, the LED light 100' has two different near-zone light buffers 2a and 2b with different relaxation times. The photoluminescent phosphor 2a preferably emits at approximately 2700 K (warm white), whilst the photoluminescent phosphor 2b emits at approximately 6500 K (cold white). The different absorption and relaxation properties can be achieved by suitable choice of phosphorus-containing materials. Due to the different application of power to the individual circuits, different brightnesses and arbitrary colour temperatures between 2700 K and 6500 K can be achieved.

Figure 4G:
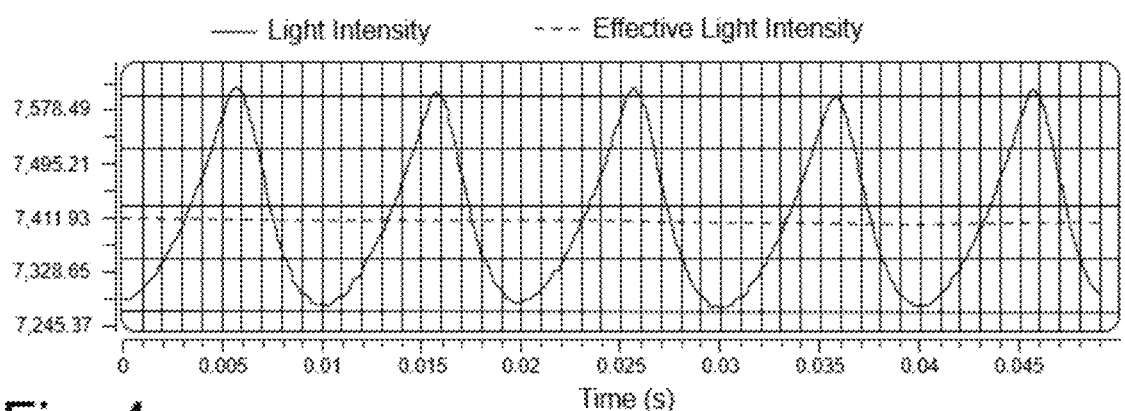
FIG. 4g shows a progression of the light intensity for the case of a combination of all smoothing measures, that is to say the optical and the electronic measures.

In order to achieve a preferred reduction of the stroboscopic flickering without considerable additional structural costs and without significant enlargement of the LED light 100, a plurality of the measures described above are combined. Preferably, all three electronic measures are combined with the optical smoothing, so that a reduction of the SVM value to almost 0 can be achieved. FIG. 4g shows the progression of light intensity for the case of a combination of the optical and all three electronic measures.

Although the invention has been illustrated and described in greater detail by the depicted exemplary embodiments, the invention is not restricted thereto. Variations, additions, and modifications can be deduced therefrom by the person skilled in the art without departing from the scope of protection of the invention.

For example, the application of the LED module 1 coated with a photoluminescent phosphor 2 and having an electronically optimised LED driver 4 is not restricted to an LED light 100 with a G9 base. Thus, the technology disclosed here is applicable, for example, to a retrofit light with an Edison base E14/E27, GU10 base, LED tube lamps with G5 or G13 base and preferably LED-COB filaments or individual SMD-LED. Furthermore, in addition to the photoluminescent phosphor 2, one or more further light buffers can be provided, for instance a diffusely scattering photoluminescent phosphor of the intermediate zone which surrounds the photoluminescent phosphor 2, and a photoluminescent phosphor of the far zone which surrounds the photoluminescent phosphor of the intermediate zone. One or more of the additional light buffers can be mounted on any glass bulb surrounding the LED module 1. This may additionally constitute a visual protection for example for a smoothing capacitor. Alternatively, or in addition, the glass can be rendered matte by means of sand blasting, in order to produce a visual protection. If a plurality of light buffers is provided, the relaxation times thereof preferably increase from the inside to the outside.

In general, "a" or "an" may be understood as a single number or a plurality, in particular in the context of "at least one" or "one or more" etc., provided that this is not explicitly precluded, for example by the expression "precisely one" etc.

If applicable, all individual features which are set out in the exemplary embodiments can be combined with one another and/or exchanged for one another, without departing from the scope of the invention.

The invention claimed is:

1. An LED light with an LED module comprising:
   at least one LED;
   an LED driver in electrical communication with the at least one LED and configured for supplying power to the at least one LED, the LED driver comprising at least one electronic component configured for smoothing of a current output to the at least one LED; and
   at least one photoluminescent phosphor coating positioned proximate to the at least one LED, wherein the at least one photoluminescent phosphor coating is configured for absorption of light energy from the at least one LED and time-delayed emission of stored light energy;
   wherein the at least one LED and the at least one electronic component of the LED driver are mounted on a circuit board.

2. The LED light according to claim 1, wherein the LED driver has a rectifier with an off-time, the off-time defining a time per period in which the at least one LED is insufficiently supplied with current by an AC component.

3. The LED light according to claim 2, wherein at least one of the LED driver and a connection of the at least one LED is configured in order to reduce the off-time of the at least one LED triggered by the rectifier.

4. The LED light according to claim 2, wherein a ratio of the off-time to an on-time is less than or equal to 0.8.

5. The LED light according to claim 2, wherein the LED driver has at least one parallel-connected smoothing capacitor parallel-connected to the at least one LED.

6. The LED light according to claim 5, wherein the at least one parallel-connected smoothing capacitor has a capacitance of 1 to 5 µF.

7. The LED light according to claim 1, wherein the LED driver is configured to increase a frequency of the current to be output to the at least one LED.

8. The LED light according to claim 7, wherein the LED driver has at least one component selected from the group consisting of an integrated circuit (IC), a current limiter diode, and an internal semiconductor-based transistor switch configured for at least one of increasing the frequency and modulating the current to be output to the at least one LED.

9. The LED light according to claim 1, wherein the at least one photoluminescent phosphor coating comprises at least one of a phosphor and quantum dots.

10. The LED light according to claim 1, wherein the at least one photoluminescent phosphor coating has a relaxation time of 5 ms or more.

11. The LED light according to claim 1, further comprising a base electrically connected to the LED driver and mechanically connectable to a light fixture.

12. The LED light according to claim 1, further comprising a closed gas-tight glass shell, wherein the LED module and the LED driver are arranged in the glass shell.

13. The LED light according to claim 1, wherein:
   the at least one photoluminescent phosphor coating comprises a first photoluminescent phosphor coating and a second photoluminescent phosphor coating;
   the LED driver is a two-channel driver; and
   the at least one LED comprises two LED-strands controllable by the LED driver, wherein the first photoluminescent phosphor coating is positioned proximate one of the two LED-strands and the second photoluminescent phosphor coating is positioned proximate the other of the two LED-strands.

14. The LED light according to claim 13 wherein the first photoluminescent phosphor coating has a light color of approximately 2700 K and the second photoluminescent phosphor coating has a light color of approximately 6500 K.

15. The LED light according to claim 13, wherein the first photoluminescent phosphor coating and the second photoluminescent phosphor coating are arranged adjacent to one another and are configured to be illuminated by the at least one LED.

16. The LED light according to claim 12, wherein the closed gas-tight glass shell contains a helium-containing gas.

17. The LED light according to claim 13, wherein the first photoluminescent phosphor coating and the second photoluminescent phosphor coating have different relaxation times.

18. The LED light according to claim 1, wherein the at least one photoluminescent phosphor coating has a relaxation time that substantially matches a time period between light flux peaks of the at least one LED.

19. The LED light according to claim 1, wherein the photoluminescent phosphor coating is directly in contact with the at least one LED.

* * * * *